United States Patent [19]

Shikatani et al.

[11] Patent Number: 4,632,884

[45] Date of Patent: Dec. 30, 1986

[54] MARKED SINGLE-CRYSTAL III-V GROUP COMPOUND SEMICONDUCTOR WAFER

[75] Inventors: Osamu Shikatani; Jun Yamaguchi, both of Hyogo, Japan

[73] Assignee: Sumitomo Electric Industries, Ltd., Japan

[21] Appl. No.: 672,882

[22] Filed: Nov. 19, 1984

[30] Foreign Application Priority Data

Nov. 24, 1983 [JP] Japan .......................... 58-181255[U]

[51] Int. Cl.$^4$ .......................................... H01L 21/304
[52] U.S. Cl. ........................... 428/642; 148/DIG. 102
[58] Field of Search ............. 428/642; 148/DIG. 102; 29/577, 574

[56] References Cited

U.S. PATENT DOCUMENTS

| | | | |
|---|---|---|---|
| 3,710,101 | 1/1973 | O'Keeffe et al. | 148/DIG. 102 |
| 3,742,315 | 6/1973 | Iizuka et al. | 148/DIG. 102 |
| 3,783,044 | 1/1974 | Cheskis et al. | 148/DIG. 102 |
| 3,844,858 | 10/1974 | Bean | 148/DIG. 102 |
| 4,468,857 | 9/1984 | Christian et al. | 148/DIG. 102 |
| 4,489,139 | 12/1984 | Ohta et al. | 428/928 |

OTHER PUBLICATIONS

Warren C. Rosvold et al, IEEE Trans. on Electron Dev., vol. Ed-15, No. 9, Sep. 1968, pp. 640–644.
R. A. Leone et al., IBM Tech. Disc. Bull., vol. 14, No. 2, Jul. 1971, p. 417.
H. E. Korth, IBM Tech. Disc. Bull., vol. 18, No. 3, Aug. 1975, p. 785.
Won-Tieu Tsang et al, Appl. Phys. Letters, vol. 28, No. 1, Jan. 1, 1976, pp. 44–46.
R. C. Stevens et al, IBM Techn. Disclosure Bull., vol. 14, No. 3, Aug. 1971, p. 749.

Primary Examiner—Veronica O'Keefe
Attorney, Agent, or Firm—Stevens, Davis, Miller & Mosher

[57] ABSTRACT

In a rectangular, square or other shaped single-crystal wafer of a III-V group compound semiconductor, one corner of the wafer is cut off, provided with a marking, or the wafer has a part of the original shape of the grown single-crystal ingot left intact on one side of the wafer. With the wafers thus formed, it can be distinguished between the front and back sides of the wafer, or also the direction in which a V groove etch is to occur can be identified.

1 Claim, 10 Drawing Figures

MARKED SINGLE-CRYSTAL III-V GROUP COMPOUND SEMICONDUCTOR WAFER

BACKGROUND OF THE INVENTION

The present invention relates to a wafer of single-crystal III-V group compound semiconductor.

Semiconductors of III-V group compounds including GaAs, GaP, InP, InSb, InAs and GaSb are extensively used as light-emitting devices, light-receiving diodes and high-speed arithmetic devices. Single-crystal ingots of III-V group compound semiconductors are grown by Czochralski or horizontal Bridgeman methods. The ingot is sliced into thin wafers, which are polished and subjected to wafer processing for mounting a predetermined number of devices on a single wafer. Each wafer is then described for chip separation.

The crystals of III-V group compound semiconductors take on the sphalerite structure and belong to crystal group $\bar{4}3m$. Since these crystals do not have four-fold symmetry, the front side of their wafer must be distinguished from the back side. Once the front side of the wafer is determined, it is necessary to perform the device fabrication by knowing the direction in which a V groove etch should occur. The family of cleavage planes of the crystal of a III-V group compound semiconductor is (110). Consider slicing an ingot along the plane parallel to a face (100) so as to form a wafer having that face on the front side. This wafer has four cleavage planes perpendicular to the (100) face.

A wafer whose front side is on a (100) face has a cleavage plane which is parallel to a line perpendicular to the (100) face, and a small bow can be cut off the cleavage plane, leaving an orientation flat which indicates the orientation of the crystal concerned. The crystallographic orientation of a compound semiconductor cannot be correctly identified by a single orientation flat. This is because the crystal of a compound semiconductor does not have four-fold symmetry and an axis $<100>$ provides a four-fold axis of rotary inversion. Of the four cleavage planes the crystal has, two parallel planes are equivalent to each other, but those which intersect each other at right angles are non-equivalent.

The two sets of cleavage planes must be distinguished from each other since the device manufacturer is required to know the direction in which a V groove etch is to form on the wafer being processed. Mesa structures may be surrounded by V groove etches or dovetail etches. Consider a wafer which is coated with a photoresist layer having four sides parallel to the cleavage plane. If the wafer is chemically etched through the photoresist, two opposing sides of the resist coat leave a V groove etch whereas the other pair of opposing sides leave a dovetail etch.

The photoresist coat has four sides which are parallel to the cleavage plane, and at each side, the direction of etching is perpendicular to the cleavage plane. The group of cleavage planes is usually designated by Miller indices such as (011), (0$\bar{1}$1), which are collectively indicated by (0±1±1). Planes having these Miller indices are indistinguishable by themselves, but if the wafer is etched through a plane parallel to the cleavage plane, a crystal structure in a direction, $<\pm 100>$ perpendicular to the wafer surface becomes a factor that affects the rate of etching. In short, etching has eight possible directions indicated by $<1\pm1\pm1>$. By performing four inversions, the plane (l mn) is transformed to (l mn) or (l mn), wherein l, m and n are each an index having the absolute value of 1. Equivalent directions must remain the same even after four inversions. Therefore, the eight possible directions can be classified into the following two groups:

(i) l mn = 1
(ii) l mn = −1

Elements classified as (i) and (ii) also have three-fold symmetry and symmetry by mirror reflection (ie, symmetry with respect to a plane). In other words, all the elements included in (i) can be transformed back to the elements of (i) by a point group operation $\bar{4}3$ m.

Designate the front side of a wafer by (100) and the back side by ($\bar{1}$00). This method of designation is arbitrary and other Miller indices may be used. An element of (i) can be distinguished from an element of (ii) only after the components on the two other reference axes (a and b) have been determined.

Since the wafer is etched along the four sides of a photoresist coat which are parallel to a small cleavage plane, the etching proceeds not only in the m and n directions but also in the l direction. A line perpendicular to the plane in which the etching proceeds substantially has a direction $<1\pm1\pm1>$. The etching plane is (1±1±1).

According to the classification shown above, a plane (111) is equivalent to (1$\bar{1}\bar{1}$), and a plane (1$\bar{1}$1) is also equivalent to (11$\bar{1}$). The group of (111) and (1$\bar{1}\bar{1}$) is different from the group of ($\bar{1}$11) and (11$\bar{1}$). Etching proceeds at different rates in different planes. A fast etching rate produces a dovetail etch and slow etching gives a V groove etch. Therefore, if a V groove etch is formed in planes (111) and (1$\bar{1}\bar{1}$), a dovetail etch occurs in planes ($\bar{1}$11) and (11$\bar{1}$). The direction in which a V groove etch is formed can be indicated by a single straight line whereas the direction of a dovetail etch by a straight line normal to that line. In FIG. 6 which is a perspective view of a wafer, the direction of a V groove etch is indicated by M and that of a dovetail etch is indicated by R. The wafer shown has two mesa structures each having a photoresist coat F on the top. The two sides of each mesa structure indicated by M are flared downwardly. The other two sides indicated by R are tapered downwardly since the etchant penetrated deep into the underside of the photoresist coat F. In FIG. 6, that part of each mesa structure in which lies flush with the wafer surface is indicated by oblique dashed lines. Even if the resist coat F is square in shape, the bottom of each mesa structure has a rectangular form which is longer in the direction M than in the direction R. The mesa structure formed on the back side of the wafer is generally indicated by the dashed line. The relation between M and R for the mesa structure formed on the back side of the wafer is opposite to that for the mesa structure formed on the front side. Since l=−1 on the back side of the wafer, a dovetail etch is formed in a plane ($\bar{1}$11) whereas a V groove etch is formed in a plane ($\bar{1}\bar{1}$1).

Distinction between the two etch forming directions is necessary for the following reason. The fabrication of FETs and other semiconductor devices involves the wafer processing including epitaxial growth, etching, and vapor deposition of electrodes. If a metal electrode is formed on an etched area of the wafer, any step that is left on the wafer must be covered by the electrode. A V groove etch can be easily and completely filled with a vapor-deposited metal film. On the other hand, a dovetail etch having deep undercuts cannot be completely filled with a metal film, and no continuous electrode can be formed. Therefore, it is necessary to deposit a metal electrode on a wafer surface having a V groove etch. There are other occasions that require the operator to distinguish between planes where a V groove etch and a dovetail etch are formed.

In order to designate a certain crystal orientation in a wafer, not only the direction of cleavage but also the direction in which a V groove etch is to occur must be identified. The conventional method for attaining this purpose is by providing two bow-shaped orientation flats on the wafer surface. They are a major orientation flat and a minor orientation flat, which are provided at a right angle with respect to each other so as to designate both the direction of cleavage and the direction in which a V groove etch is to take place. The two orientation flats can be distinguished by the chord length of each bow. By providing the major and minor orientation flats, the operator is able to know the direction of the cleavage plane, the front side of the wafer and the direction in which a V groove etch is to form on the front side. For example, when the wafer is positioned in such a manner that the major orientation flat becomes closer toward the operator whereas the minor orientation flat is on the right side, one may determine that the side facing up is the front side of the wafer whereas the direction indicated by the major orientation flat is the one in which a V groove etch is to occur.

The foregoing discussion concerns wafers in a disk form. Because of the ease of handling, almost all of the wafers made today are disk-shaped. However, semiconductor devices could also be fabricated from rectangular wafers, and the demand for the production of rectangular wafers may increase in the future. The cleavage planes of a rectangular wafer are obvious since they are cut along cleavage planes to provide rectangular or square cross sections. However, one more marking is necessary in order to enable the identification of the direction in which a V groove etch is to form and to distinguish the front side of the wafer from the back side. Using only the cleavage plane as an orientation flat is not possible.

As far as the present inventor knows, there is no prior art showing a marking that can be used not only to distinguish between the front and back sides of a rectangular wafer of a single-crystal III-V compound semiconductor but also to identify the direction in which a V groove etch is to occur.

SUMMARY OF THE INVENTION

According to the present invention, a rectangular or square single-crystal wafer of a III-V group compound semiconductor is provided, wherein one corner of the wafer is cut off or provided with a marking, or which has part of the original shape of the grown single-crystal ingot left intact on one side of the wafer.

PREFERRED EMBODIMENTS OF THE INVENTION

Figure 1:
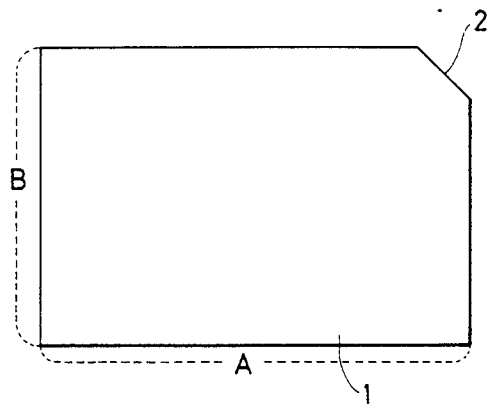
FIG. 1 is a plan view showing a rectangular wafer incorporating the concept of the present invention.
Figure 2:
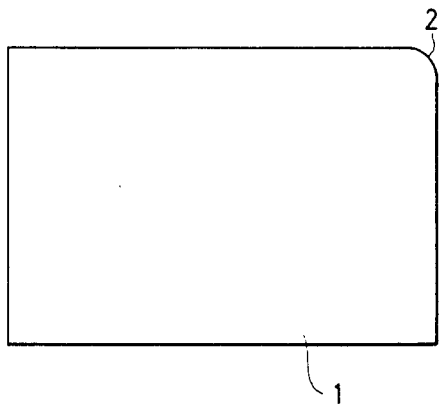
FIG. 2 is a plan view showing a rectangular wafer according to another embodiment of the present invention wherein one corner of the wafer is rounded.

One embodiment of the present invention is shown in FIG. 1 wherein a selected corner of a rectangular wafer 1 is cut off as indicated by 2. The cut corner enables the operator to distinguish between the front and back sides of the wafer and to identify the direction in which a V groove etch is to occur. For example, if the operator positions the wafer in such a manner that the longer side A of the wafer comes closer toward the operator whereas the cut edge 2 is in the upper right corner, he may identify the side facing up as the front side of the wafer and the direction normal to the side A as the one in which a V groove etch is to form. By using the longer side A, shorter side B and the cut corner 2 as parameters, the operator is able to determine accurately the front and back sides of the wafer, as well as the direction in which a V groove etch is to occur. A selected corner of the wafer may be cut off in any form; it may be triangular as shown in FIG. 1 or rounded as shown in FIG. 2. The reason why any shape may be cut at one corner of the wafer is that the cut line does not run along any of the cleavage planes of the wafer. A triangular notch may have two equal sides or the sides need not equal to each other. This is because the rectangular wafer is symmetrical with respect to the diagonal line passing through the cut corner.

Figure 3:
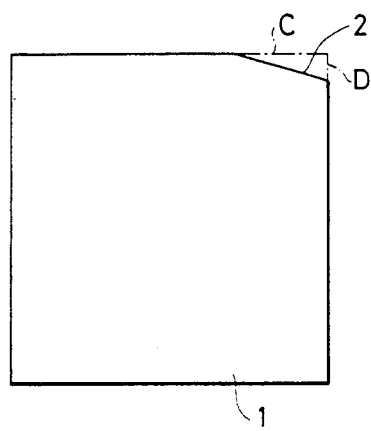
FIG. 3 is a plan view showing a square wafer incorporating the concept of the present invention.
Figure 4:
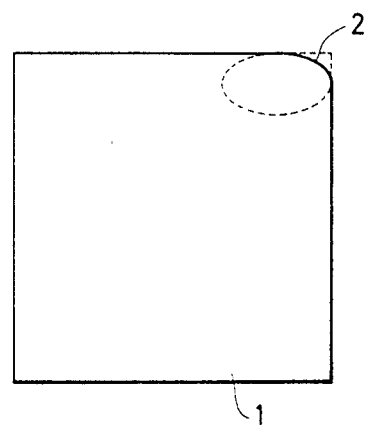
FIG. 4 is a plan view showing another embodiment of the square wafer wherein one corner of wafer is cut off to provide an edge corresponding to a quarter of an ellipse.

A square wafer is symmetrical with respect to either of the two diagonal lines, so a non-symmetric portion must be cut from one corner of the wafer. If a symmetrical shape is cut, the front side of the remaining wafer cannot be distinguished from its back side. FIG. 3 shows another embodiment of the present invention wherein a non-equilateral triangle is cut from one corner of a square wafer. The triangle indicated by the phantom line in FIG. 3 has a long side C and a short side D. Since the cut edge 2 is asymmetric with respect to the diagonal line passing through that edge, the operator is able not only to distinguish between the front and back sides of the wafer but also to identify the direction in which a V groove etch is to occur. For example, if the operator positions the wafer in such a manner that the cut edge is in the upper right corner whereas imaginary long side C of the triangular cut is horizontally, the operator may identify the side facing up as the front side of the wafer and the direction perpendicular to the long side C as the one in which a V groove etch is to occur. The purpose of the present invention can be achieved so long as the cut edge 2 is asymmetric with respect to the diagonal line passing through that edge. Therefore, instead of a non-equilateral triangle, one corner of the wafer may be rounded as shown in FIG. 4 so that the cut edge forms one quarter of an ellipse. Even in this case, a long side C and a short side D may be conceived and they enable the operator not only to distinguish the front and back sides of the wafer but also to identify the direction in which V groove etch is to form.

Figure 5:
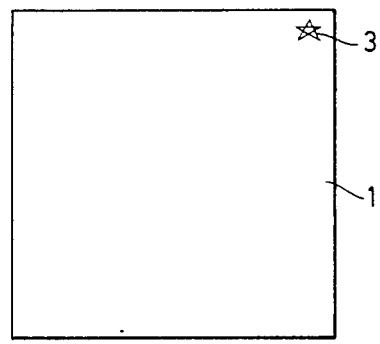
FIG. 5 is a plan view showing a rectangular wafer according to still another embodiment of the present invention wherein one corner of the wafer is provided with a marking.
Figure 6:
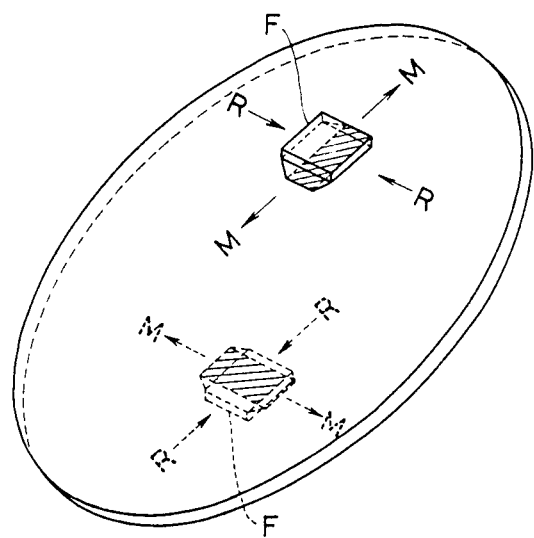
FIG. 6 is a perspective view of a single-crystal wafer of a III-V group compound semiconductor, wherein a mesa structure is provided on both the front and back sides of the wafer in such a manner that the direction in which a V groove etch is formed is at a right angle to the direction in which a dovetail etch is formed.

In the foregoing embodiments, one corner is cut to provide an edge that is common to both the front and back sides of the wafer, so the wafer has one less asymmetric element as compared with a wafer that is provided with a marking on either the front or back side of one corner of the wafer. This latter case is shown in FIG. 5, wherein a marking 3 is provided at one corner of a rectangular wafer 1 on either the front or back side thereof. This mark enables the operator to distinguish between the front and back sides of the wafer. Whether the wafer is square or rectangular, the marking need be provided on only one corner of the wafer. For example, when the operator positions the wafer in such a manner that the marking is at the upper right corner, he is able to identify the side facing up as the front side of the wafer and the direction normal to the horizontal side as the one in which a V groove etch is to occur. The same result can be obtained even if the marking 3 is on a diagonal line of a square wafer because the marking provided on one corner has a higher symmetry than a cut edge.

A marking may be provided at one corner of the wafer with a rubber stamp or any writing device. Alternatively, a depression may be used as the marking. Visibility is the only requirement for the marking and any method that satisfies this need may be used.

Figure 7A:
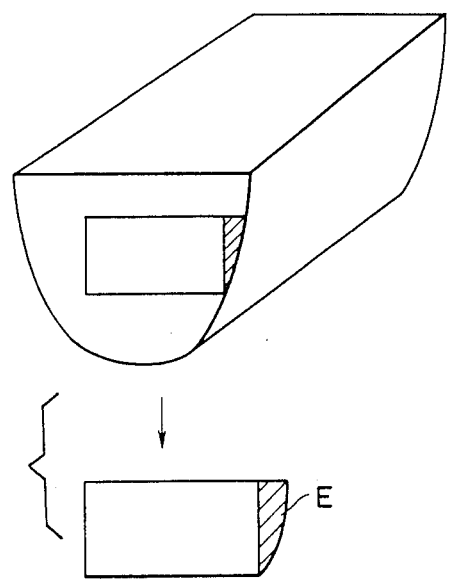
FIGS. 7A and 7B are perspective views of a boat-shaped ingot and a plan view showing a generally rectangular wafer with part of the initial D-shaped cross section left on the right side in FIG. 7A and on the left side in FIG. 7B.
Figure 7B:
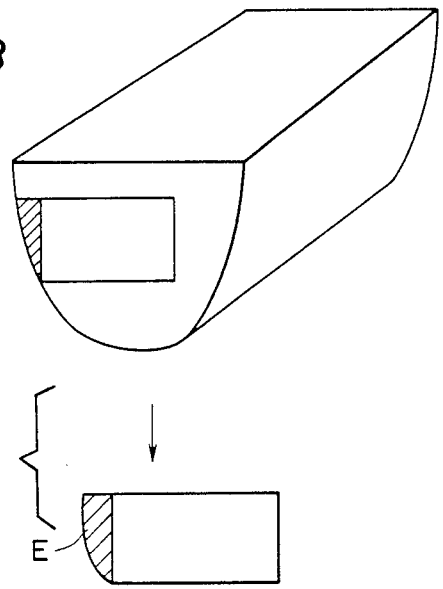

The front and back sides of a wafer sliced from a single-crystal ingot grown by the boat method may be distinguished from each other by leaving intact part of the original D-shape of the ingot as indicated by hatching in FIG. 7. The wafer shown in FIG. 7A has a circular arc E left intact on the right side, whereas the wafer shown in FIG. 7B has a circular arc E on the opposite side left intact.

If the wafers to be processed consist of two types, those shown in FIG. 7A and FIG. 7B, the circular arc portion E left intact on one side of each wafer is no longer usable in distinguishing between its front and back sides. In this case, the ingot of FIG. 7A may be designated type I, and that of FIG. 7B as type II. Wafers sliced from the ingot of type I are checked for their front and back sides separately from wafers sliced from the ingot of type II. By this method, the operator will be able to distinguish between the front and back sides of a set of wafers consisting of those shown in FIG. 7A and FIG. 7B. The circular arc portion E left intact on one side of the wafer, whether it is of the type shown in FIG. 7A or 7B, generally has poor characteristics and hence is not used as a material for the semiconductor device proper. However, this portion may be used as a tab by which the operator can hold the wafer with vacuum tweezers in the wafer handling.

Figure 8:
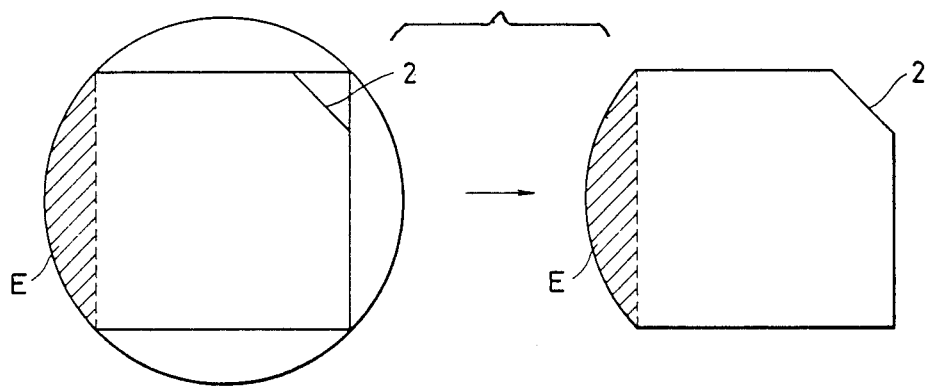
FIGS. 8 and 9 are plan views showing modifications of the embodiment of FIG. 7 wherein part of the original shape of a single-crystal is left on one side of the wafer.
Figure 9:
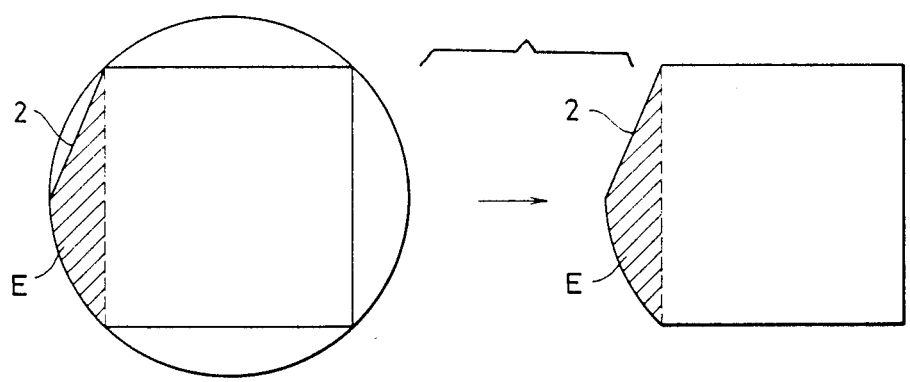

FIGS. 8 and 9 show a rectangular wafer which is sliced from a cylindrical single-crystal ingot, leaving part of the circular cross section intact on one side of the wafer. This intact portion also helps the operator to distinguish between the front and back sides of the rectangular wafer. In FIG. 8, one corner of the wafer is cut as in the cases of FIGS. 1 to 4. Alternatively, either the upper or the lower part of the circular arc may be cut off as shown in FIG. 9. In either case, the arc portion E may be used as a tab by which the operator can hold the wafer with vacuum tweezers.

What is claimed is:

1. A rectangular single-crystal wafer of a III-V group compound for semiconductor manufacture having an indexing mark for an operator to recognize the front and back surfaces to orient a face for etching, said indexing mark comprising one corner cut off the rectangle so that the position of the cut off corner may be used to orient the desired surface.

* * * * *